United States Patent
Inoue et al.

(10) Patent No.: US 8,269,577 B2
(45) Date of Patent: Sep. 18, 2012

(54) ACOUSTIC WAVE FILTER, DUPLEXER, COMMUNICATION MODULE, AND COMMUNICATION APPARATUS

(75) Inventors: Shogo Inoue, Kawasaki (JP); Michio Miura, Kawasaki (JP); Takashi Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 289 days.

(21) Appl. No.: 12/576,576

(22) Filed: Oct. 9, 2009

(65) Prior Publication Data

US 2010/0109801 A1   May 6, 2010

(30) Foreign Application Priority Data

Oct. 31, 2008  (JP) ................................. 2008-281959

(51) Int. Cl.
*H03H 9/00* (2006.01)
*H03H 9/64* (2006.01)

(52) U.S. Cl. ....................................... 333/133; 333/194

(58) Field of Classification Search .................. 333/133, 333/187, 188, 189, 191, 192, 193, 194, 195
See application file for complete search history.

(56) References Cited

U.S. PATENT DOCUMENTS

| | | | | |
|---|---|---|---|---|
| 6,552,631 B2 * | 4/2003 | Huor | ............................. | 333/195 |
| 6,844,795 B2 * | 1/2005 | Inose | ............................ | 333/193 |
| 6,884,795 B2 * | 4/2005 | Labrie | ........................... | 514/179 |
| 7,230,365 B2 | 6/2007 | Nishiyama et al. | | |
| 7,411,334 B2 | 8/2008 | Nishiyama et al. | | |
| 7,418,772 B2 | 9/2008 | Nishiyama et al. | | |
| 7,583,936 B2 | 9/2009 | Kovacs et al. | | |
| 2006/0267708 A1 * | 11/2006 | Matsuda et al. | .............. | 333/133 |
| 2007/0024392 A1 * | 2/2007 | Inoue et al. | ................... | 333/133 |
| 2007/0191055 A1 | 8/2007 | Kovacs et al. | | |

FOREIGN PATENT DOCUMENTS

| | | |
|---|---|---|
| EP | 1391988 | 2/2004 |
| JP | 08-065097 A | 3/1996 |
| JP | 2004-112748 A | 4/2004 |
| KR | 10-2004-0077950 A | 9/2004 |
| KR | 10-2006-0115962 A | 11/2006 |
| WO | WO-98/52279 | 11/1998 |
| WO | WO 03/069777 A1 | 8/2003 |

* cited by examiner

*Primary Examiner* — Dean O Takaoka
(74) *Attorney, Agent, or Firm* — Chen Yoshimura LLP

(57) ABSTRACT

In an acoustic wave filter, a notch resonator is connected in series or parallel with a plurality of acoustic wave resonators connected in a ladder shape. The notch resonator has a main resonant frequency that is substantially equal to a sub-resonant frequency of the acoustic wave resonators. With this configuration, the occurrence of sub-resonant responses in filter characteristics can be suppressed, resulting in an improvement in communication characteristics.

22 Claims, 20 Drawing Sheets

Bandpass characteristics of ladder-type filter

Exemplary bandpass characteristics of ladder-type filter and series notch resonator in wide frequency band —— Bandpass characteristics of ladder-type filter
----- Bndpass characteristics of series notch resonator Exemplary bandpass characteristics of ladder-type filter in which series notch resonator is connected, in wide frequency band ——— Conventional ladder-type filter
----- Ladder-type filter in which series notch resonator is connected (present embodiment)

Exemplary bandpass characteristics of ladder-type filter and parallel notch resonator in wide frequency band ——— Bandpass characteristics of ladder-type filter
----- Bndpass characteristics of parallel notch resonator Exemplary bandpass characteristics of ladder-type filter in which parallel notch resonator is connected, in wide frequency band ——— Conventional ladder-type filter
----- Ladder-type filter in which parallel notch resonator is connected (present embodiment)

ACOUSTIC WAVE FILTER, DUPLEXER, COMMUNICATION MODULE, AND COMMUNICATION APPARATUS

CROSS-REFERENCE TO RELATED APPLICATIONS

This application is based upon and claims the benefit of priority of the prior Japanese Patent Application No. 2008-281959 filed on Oct. 31, 2008, the entire contents of which are incorporated herein by reference.

FIELD

The embodiment disclosed in the present application relates to an acoustic wave filter, a duplexer, a communication module, and a communication apparatus.

BACKGROUND

A high frequency circuit for mobile phones is provided with a filter or a duplexer. The filter or the duplexer often includes acoustic wave resonators such as a surface acoustic wave resonator, a love wave resonator, a boundary acoustic wave resonator, and a film bulk acoustic resonator.

FIG. 1A is a plan view schematically illustrating an exemplary structure of the surface acoustic wave resonator. FIG. 1B is a cross-sectional view taken along a line Z-Z in FIG. 1A. In the surface acoustic wave resonator illustrated in FIGS. 1A and 1B, a pair of comb-shaped electrodes 102 are formed on a surface of a piezoelectric substrate 101. On both sides of the comb-shaped electrodes 102, grating reflectors 103a and 103b are provided.

FIG. 2A is a plan view schematically illustrating an exemplary structure of the love wave resonator. FIG. 2B is a cross-sectional view taken along a line Z-Z in FIG. 2A. The love wave resonator illustrated in FIGS. 2A and 2B is obtained by depositing a first dielectric 104 on the surface acoustic wave resonator including the piezoelectric substrate 101, the comb-shaped electrodes 102, and the grating reflectors 103a and 103b. Patent Document 1 (JP 2004-112748 A) discloses the love wave resonator as illustrated in FIGS. 2A and 2B.

FIG. 3A is a plan view schematically illustrating an exemplary structure of the boundary acoustic wave resonator. FIG. 3B is a cross-sectional view taken along a line Z-Z in FIG. 3A. The boundary acoustic wave resonator illustrated in FIGS. 3A and 3B is obtained by depositing the first dielectric 104 and a second dielectric 105 on the surface acoustic wave resonator including the piezoelectric substrate 101, the comb-shaped electrodes 102, and the grating reflectors 103a and 103b. Patent Document 2 (JP 10(1998)-549008 A) discloses the boundary acoustic wave resonator as illustrated in FIGS. 3A and 3B.

FIG. 4A is a plan view schematically illustrating an exemplary structure of the film bulk acoustic resonator. FIG. 4B is a cross-sectional view taken along a line Z-Z in FIG. 4A. In the film bulk acoustic resonator illustrated in FIGS. 4A and 4B, an upper electrode 202, a lower electrode 203, and a piezoelectric film 204 are formed on a substrate 201. The piezoelectric film 204 is sandwiched between the upper electrode 202 and the lower electrode 203. An excitation portion 206 is a region where the upper electrode 202 and the lower electrode 203 face each other. A through hole 205, an air gap, and the like are provided below the excitation portion 206.

FIG. 5 illustrates exemplary admittance characteristics of the acoustic wave resonators illustrated in FIGS. 1 to 4 in the vicinity of a main resonant frequency. The acoustic wave resonators illustrated in FIGS. 1 to 4 have double resonance characteristics with a main resonant frequency ($f_{r0}$) and a main antiresonant frequency ($f_{a0}$). The main resonant frequency ($f_{r0}$) and the main antiresonant frequency ($f_{a0}$) have values close to each other.

FIG. 6A is a circuit diagram of a ladder-type filter in which any of the acoustic wave resonators illustrated in FIGS. 1 to 4 are connected in a ladder shape. Connecting acoustic wave resonators 300 in a ladder shape as illustrated in FIG. 6 achieves a ladder-type filter having bandpass characteristics in which high frequency components and low frequency components are suppressed as illustrated in FIG. 6B.

FIG. 7 illustrates the principle on which the bandpass characteristics of the ladder-type filter are obtained. In FIG. 7, a solid line indicates the bandpass characteristics obtained when the acoustic wave resonator alone is connected in series (hereinafter, referred to as a series resonator). The series resonator forms a low pass filter having a turnover frequency between a resonant frequency ($f_{rs}$) and an antiresonant frequency ($f_{as}$). In FIG. 7, a dashed line indicates the bandpass characteristics obtained when the acoustic wave resonator alone is connected in parallel (hereinafter, referred to as a parallel resonator). The parallel resonator forms a high pass filter having a turnover frequency between a resonant frequency ($f_{rp}$) and an antiresonant frequency ($f_{ap}$). The resonant frequency ($f_{rs}$) of the series resonator and the antiresonant frequency ($f_{ap}$) of the parallel resonator are set to be substantially equal to each other. The ladder-type filter, which includes the series resonators and the parallel resonators, has the bandpass characteristics as illustrated in FIG. 6B as a result that the characteristics indicated by the solid line and the characteristics indicated by the dashed line in FIG. 7 are synthesized.

Since the resonance phenomena of the acoustic wave resonator occur due to mechanical vibrations, they often include not only main resonance (main antiresonance) but also several kinds of sub-resonance (sub-antiresonance) corresponding to various vibration modes.

FIG. 8 illustrates exemplary admittance characteristics of the acoustic wave resonator. FIG. 8 illustrates frequency characteristics in a wide frequency band including sub-resonant frequencies. As illustrated in FIG. 8, in a frequency band away from the main resonant frequency ($f_{r0}$) and the main antiresonant frequency ($f_{a0}$), a sub-resonant frequency ($f_{r1}$) and a sub-antiresonant frequency ($f_{a1}$) exist. Further, in a frequency band away from the sub-resonant frequency ($f_{r1}$) and the sub-antiresonant frequency ($f_{a1}$), a sub-resonant frequency ($f_{r2}$) and a sub-antiresonant frequency ($f_{a2}$) exist. The number of occurrences of the sub-resonance (sub-antiresonance) varies depending on the type of the acoustic wave resonator. Further, a frequency interval between the sub-resonance and the main resonance varies depending on the type of the acoustic wave resonator. Even in the acoustic wave resonators of the same type, however, the number of occurrences of the sub-resonance (sub-antiresonance) and the frequency interval between the sub-resonance and the main resonance may vary depending on the material, film thickness, and the like of the acoustic wave resonator.

As described above, since the acoustic wave resonator produces the sub-resonance, the filter using the acoustic wave resonators accordingly has passbands formed based on the sub-resonance.

FIG. 9 illustrates exemplary bandpass characteristics of the ladder-type filter using the acoustic wave resonators in a wide frequency band. As illustrated in FIG. 9, the ladder-type filter using the acoustic wave resonators has not only a main passband (referred to as a main resonant response) formed due to the main resonance, but also passbands (referred to as sub-resonant responses) formed due to the sub-resonance. While the acoustic wave resonator generally is specified to suppress frequency components in frequency bands other than the main passband formed due to the main resonance (hereinafter, referred to as suppression specifications), the suppression specifications may not be met due to the sub-resonant responses as illustrated in FIG. 9.

SUMMARY

An acoustic wave filter disclosed in the present application includes acoustic wave resonators. The filter includes a notch resonator connected in series or parallel with the acoustic wave resonators. The notch resonator has a main resonant frequency that is substantially equal to a sub-resonant frequency of the acoustic wave resonators.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

A duplexer disclosed in the present application includes: an antenna terminal connected to an antenna; a reception circuit that is connected to the antenna terminal and receives a reception signal from the antenna via the antenna terminal; a transmission circuit that is connected to the antenna terminal and transmits a transmission signal to the antenna via the antenna terminal; and a notch resonator connected to the antenna terminal. The reception circuit and the transmission circuit have acoustic wave resonators, and the notch resonator has a main resonant frequency that is substantially equal to a sub-resonant frequency of the acoustic wave resonators.

A communication module disclosed in the present application includes the above-described acoustic wave filter or the above-described duplexer. In the acoustic wave filter, the acoustic wave resonators can be connected in a ladder shape. In the acoustic wave filter, the notch resonator can be connected in series to an input terminal or an output terminal. In the acoustic wave filter, the notch resonator can be connected in parallel to an input terminal or an output terminal. In the duplexer, the notch resonator can be connected in parallel to the antenna terminal.

(Embodiment)

Configuration of an acoustic wave filter

An acoustic wave filter according to the present embodiment is characterized by connecting a notch resonator, thereby suppressing sub-resonant responses. The notch resonator is an acoustic wave resonator that resonates at a main resonant frequency or a main antiresonant frequency. The main resonant frequency or the main antiresonant frequency is substantially equal to a sub-resonant frequency or a sub-antiresonant frequency of acoustic wave resonators included in the acoustic wave filter.

For ease of explanation of the principle, a description will be given of a filter that uses acoustic wave resonators having only one frequency band in which sub-resonance occurs.

Figure 1A:
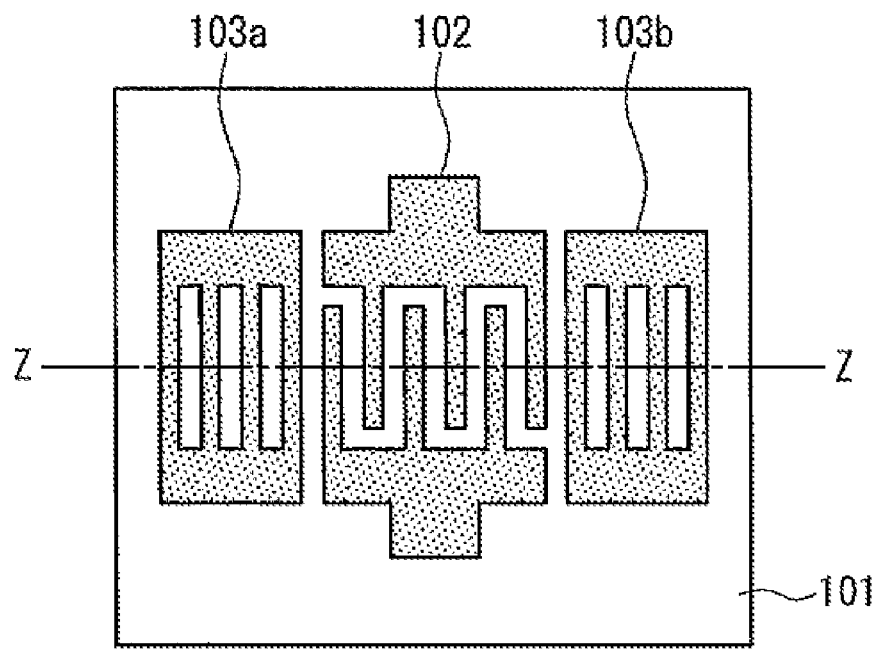
FIG. 1A is a plan view illustrating an exemplary structure of a surface acoustic wave resonator.
Figure 1B:
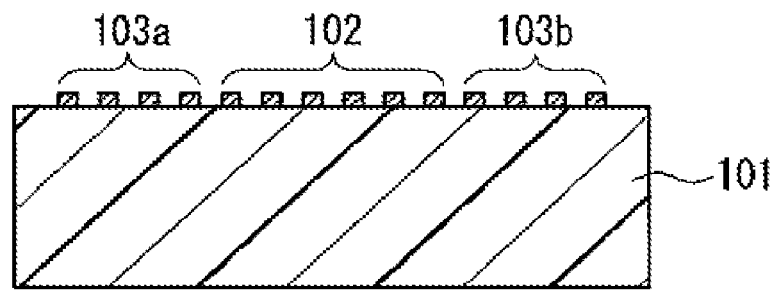
FIG. 1B is a cross-sectional view taken along a line Z-Z in FIG. 1A.
Figure 2A:
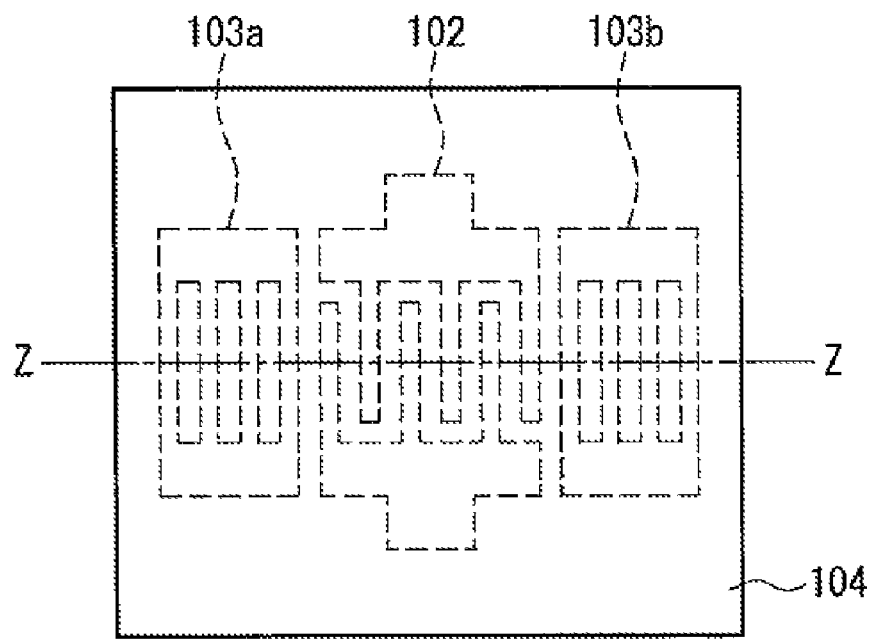
FIG. 2A is a plan view illustrating an exemplary structure of a love wave resonator.
Figure 2B:
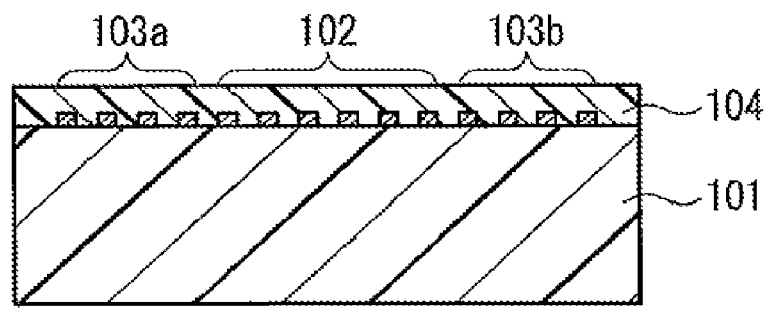
FIG. 2B is a cross-sectional view taken along a line Z-Z in FIG. 2A.
Figure 3A:
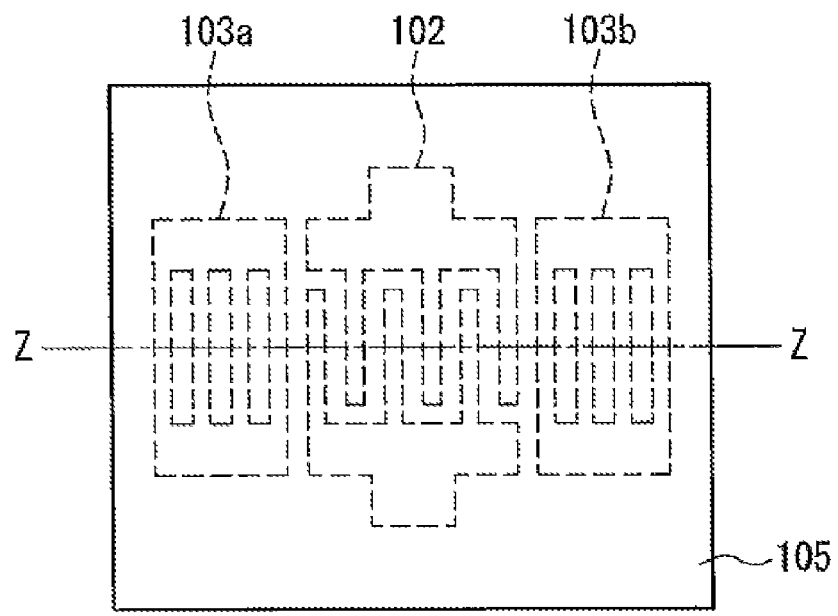
FIG. 3A is a plan view illustrating an exemplary structure of a boundary acoustic wave resonator.
Figure 3B:
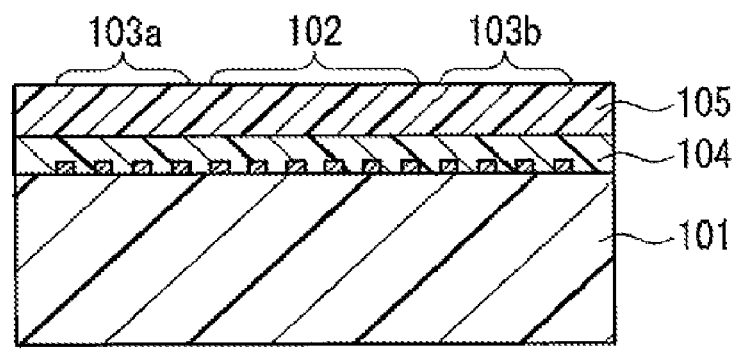
FIG. 3B is a cross-sectional view taken along a line Z-Z in FIG. 3A.
Figure 4A:
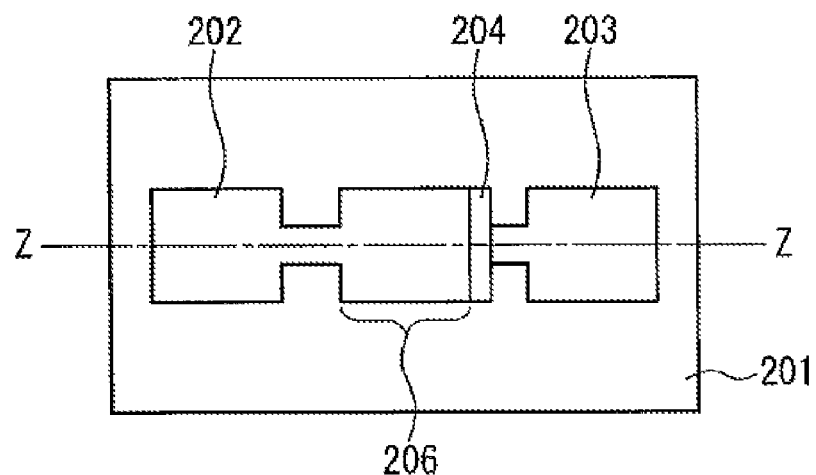
FIG. 4A is a plan view illustrating an exemplary structure of a bulk acoustic resonator.
Figure 4B:
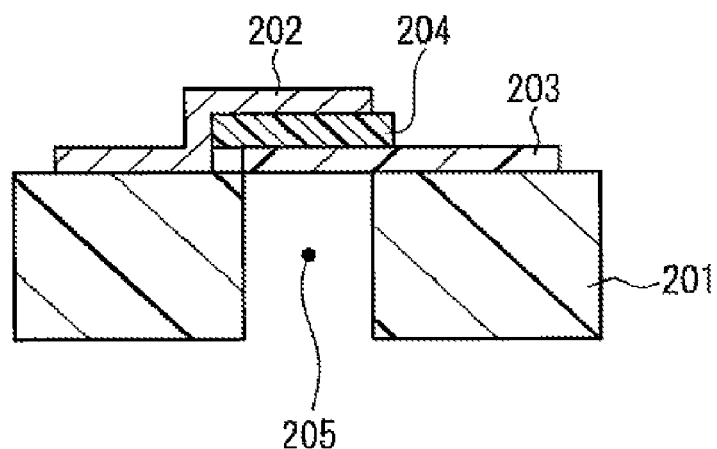
FIG. 4B is a cross-sectional view taken along a line Z-Z in FIG. 4A.
Figure 5:
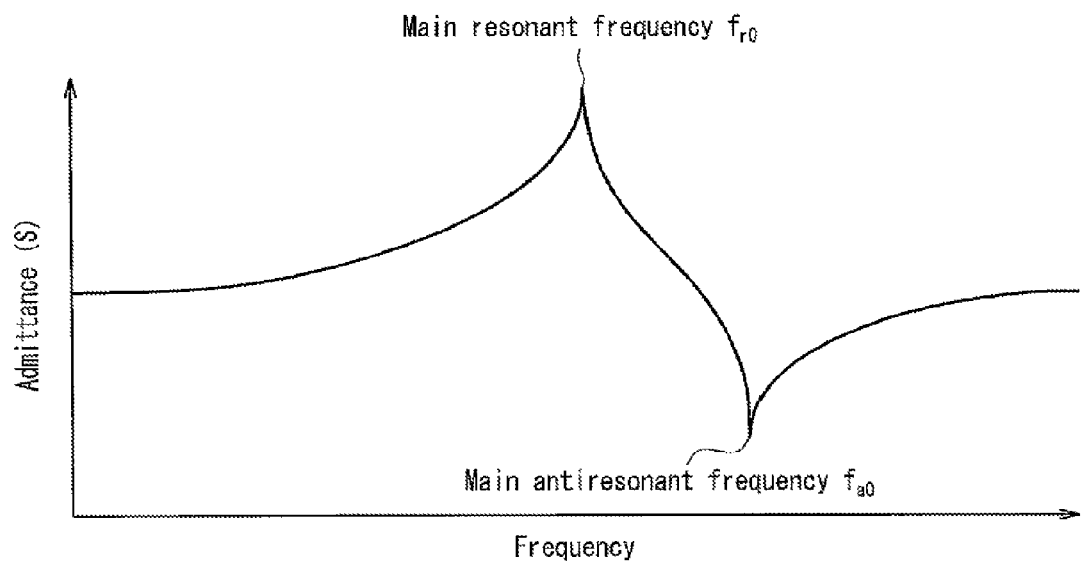
FIG. 5 is a characteristics diagram illustrating exemplary admittance characteristics of the acoustic wave resonator.
Figure 6A:
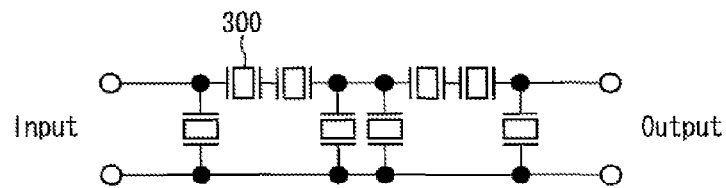
FIG. 6A is a circuit diagram of a ladder-type filter.
Figure 6B:
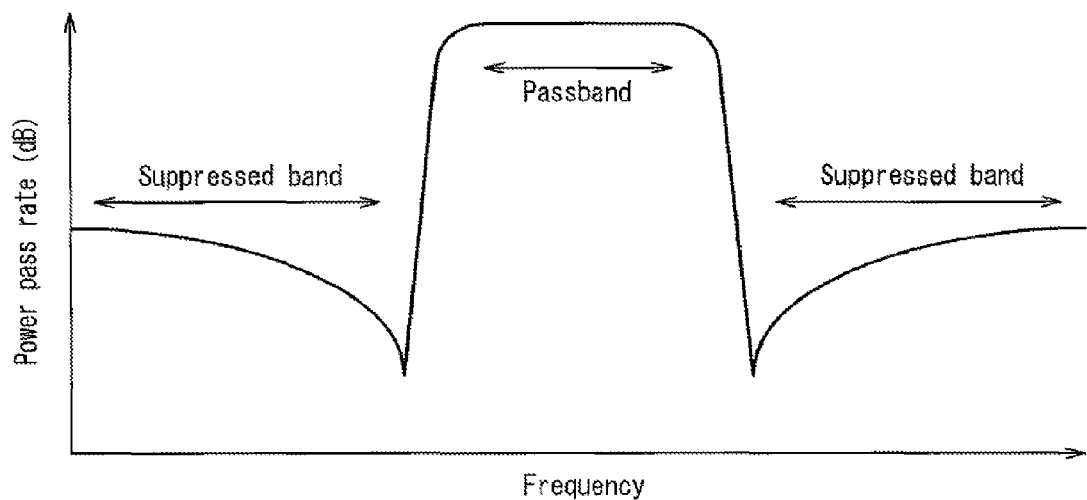
FIG. 6B is a characteristics diagram illustrating bandpass characteristics of the ladder-type filter.
Figure 7:
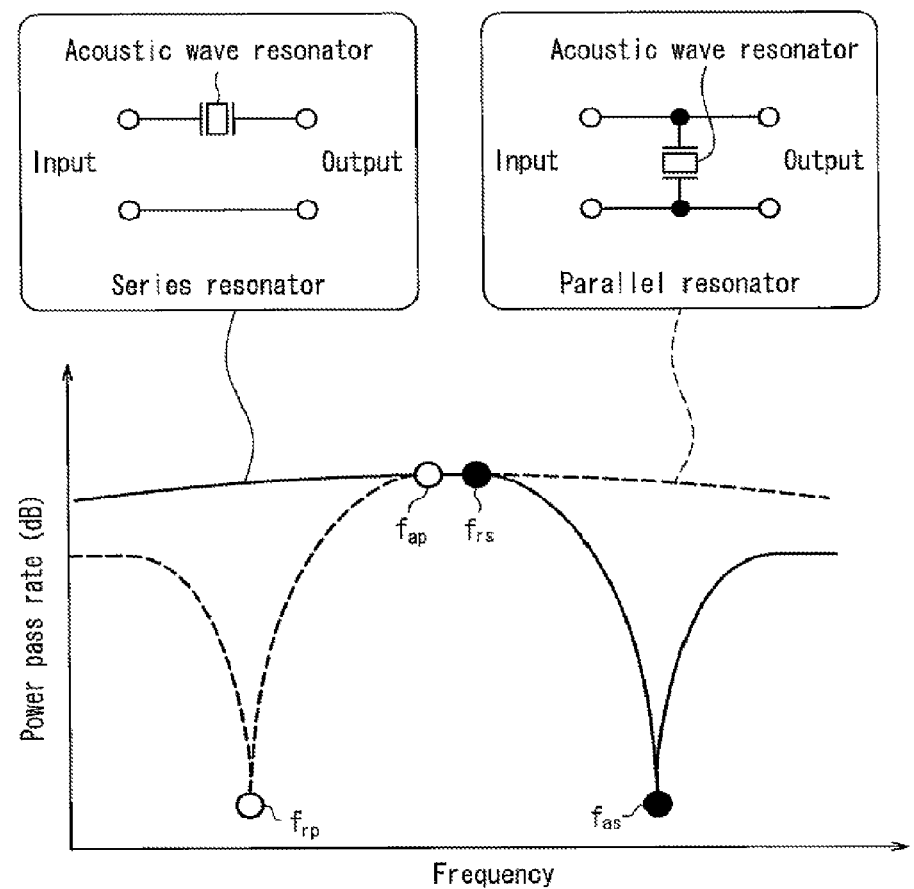
FIG. 7 is a characteristics diagram for explaining the principle on which the bandpass characteristics of the ladder-type filter are obtained.
Figure 8:
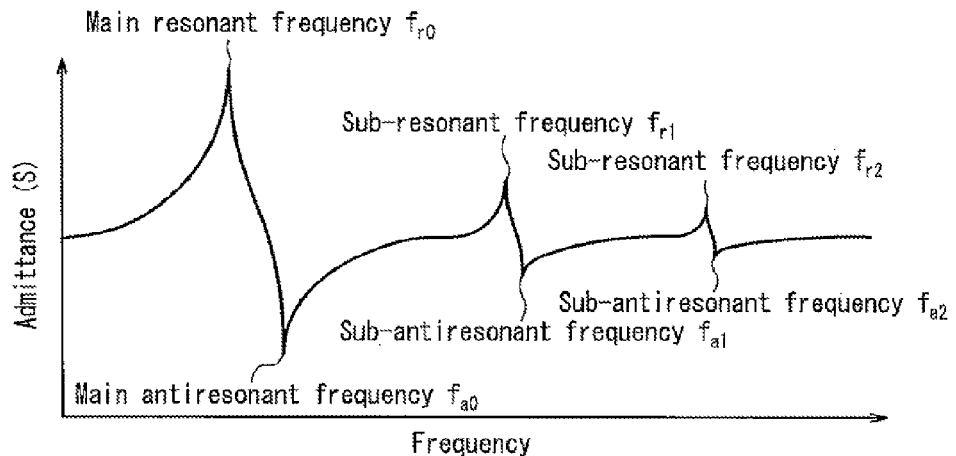
FIG. 8 is a characteristics diagram illustrating exemplary admittance characteristics of the acoustic wave resonator in a wide frequency band.
Figure 9:
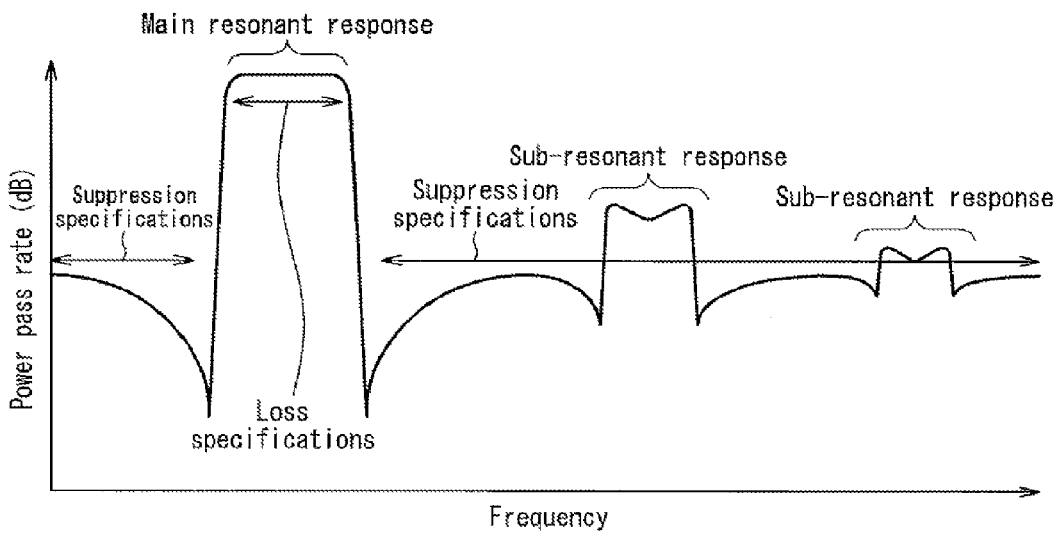
FIG. 9 is a characteristics diagram illustrating exemplary bandpass characteristics of the ladder-type acoustic wave filter in a wide frequency band.
Figure 10A:
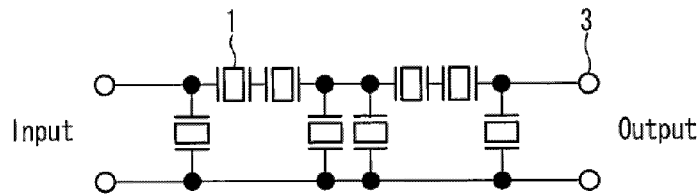
FIG. 10A is a circuit diagram of a ladder-type filter.
Figure 10B:
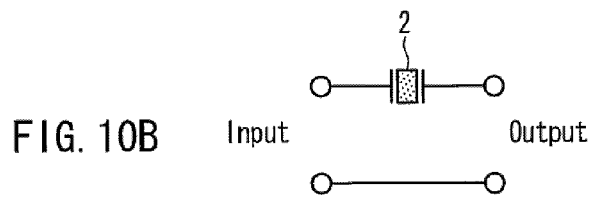
FIG. 10B is a circuit diagram of a series notch resonator.
Figure 10C:
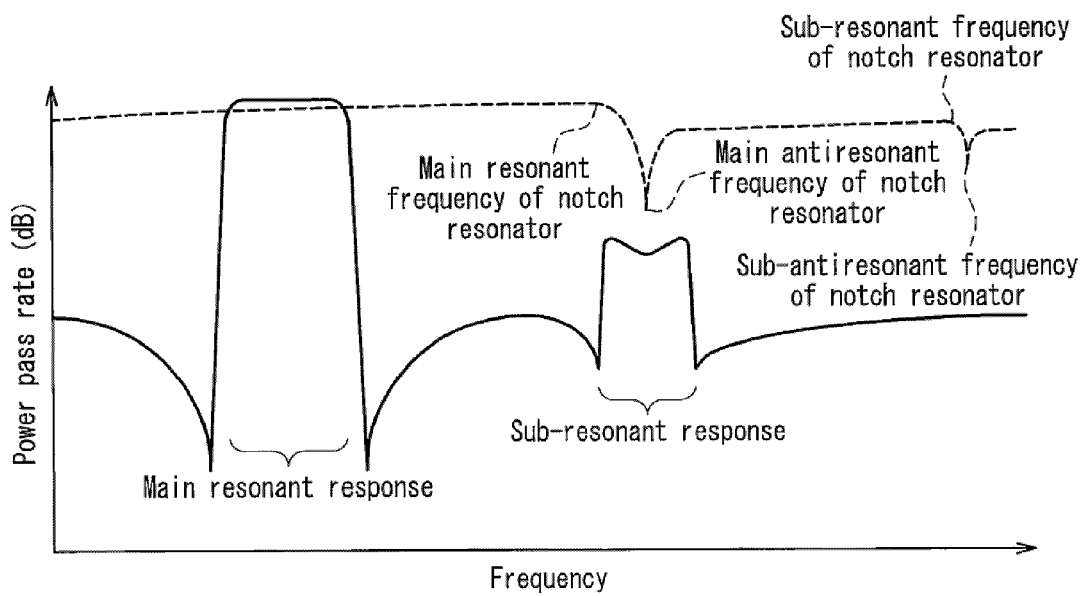
FIG. 10C is a characteristics diagram illustrating exemplary bandpass characteristics of the ladder-type filter and the series notch resonator in a wide frequency band.
Figure 11A:
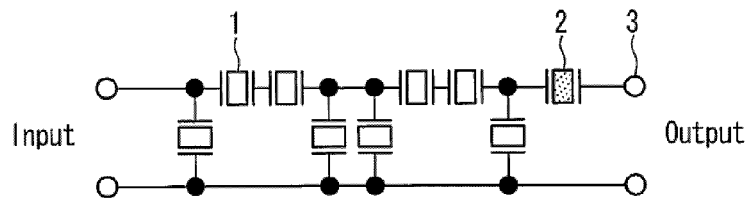
FIG. 11A is a circuit diagram of a ladder-type filter in which the series notch resonator is connected.
Figure 11B:
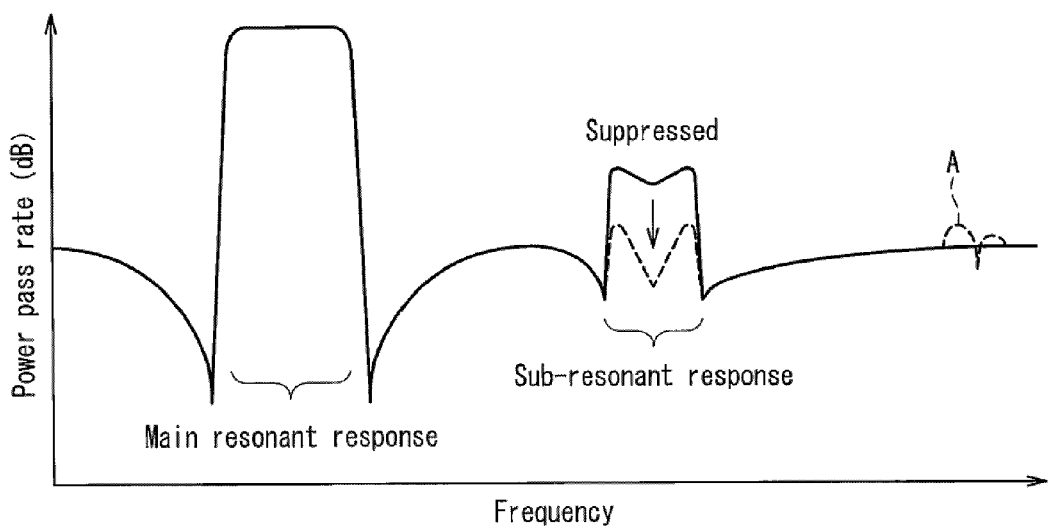
FIG. 11B is a characteristics diagram illustrating exemplary bandpass characteristics of the ladder-type filter in which the series notch resonator is connected, in a wide frequency band.

FIG. 10A is a circuit diagram of a ladder-type filter in which a plurality of acoustic wave resonators 1 are connected in a ladder shape. FIG. 10B is a circuit diagram of a series notch resonator 2. FIG. 10C illustrates exemplary bandpass characteristics of the ladder-type filter and the series notch resonator in a wide frequency band. In FIG. 10C, a solid line indicates the bandpass characteristics of the ladder-type filter, and a dashed line indicates the bandpass characteristics of the series notch resonator. FIG. 11A is a circuit diagram of a ladder-type filter obtained by connecting the series notch resonator illustrated in FIG. 10B to the ladder-type filter illustrated in FIG. 10A. FIG. 11B illustrates bandpass characteristics of a conventional ladder-type filter and the ladder-type filter illustrated in FIG. 11A. In FIG. 11B, a solid line indicates the bandpass characteristics of the conventional ladder-type filter, and a dashed line indicates the bandpass characteristics of the ladder-type filter illustrated in FIG. 11A.

As illustrated in FIG. 10C, the series notch resonator 2 illustrated in FIG. 10B has a main antiresonant frequency that is set close to a sub-resonant response frequency of the ladder-type filter illustrated in FIG. 10A. A surface acoustic wave resonator, a love wave resonator, or a boundary acoustic wave resonator used as the series notch resonator 2 has a main resonant frequency and a main antiresonant frequency that can be adjusted according to the film thickness, width, period, and the like of a comb-shaped electrode. Further, a film bulk acoustic resonator has a main resonant frequency and a main antiresonant frequency that can be adjusted according to the film thickness and the like of an upper electrode, a lower electrode, and a piezoelectric film.

For example, FIG. 11A illustrates a ladder-type filter obtained by connecting the series notch resonator 2 illustrated in FIG. 10B to an output terminal 3 of the ladder-type filter illustrated in FIG. 10A. The ladder-type filter illustrated in FIG. 11A has its sub-resonant response suppressed as shown in the bandpass characteristics indicated by the dashed line in FIG. 11B. As indicated by A in FIG. 11B, the suppression characteristics (dashed line) of the series notch resonator 2 vary slightly in the vicinity of a sub-resonant frequency and a sub-antiresonant frequency as compared with the characteristics (solid line) of the ladder-type filter in which the series notch resonator 2 is not connected. However, the variation in the suppression characteristics indicated by A is so small that it has no adverse effect on the performance of the filter. Note here that an input/output impedance of the filter may be shifted by connecting the series notch resonator 2 to the ladder-type filter. Thus, in order to allow the filter to have an input/output impedance of a desired value, it is preferable to adjust a capacitance or the like of the acoustic wave resonators 1 included in the filter.

Figure 12A:
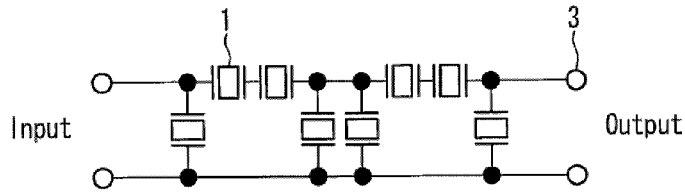
FIG. 12A is a circuit diagram of a ladder-type filter.
Figure 12B:
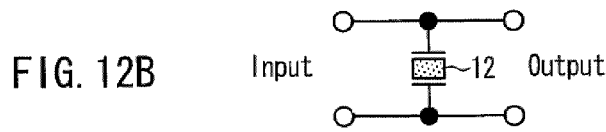
FIG. 12B is a circuit diagram of a parallel notch resonator.
Figure 12C:
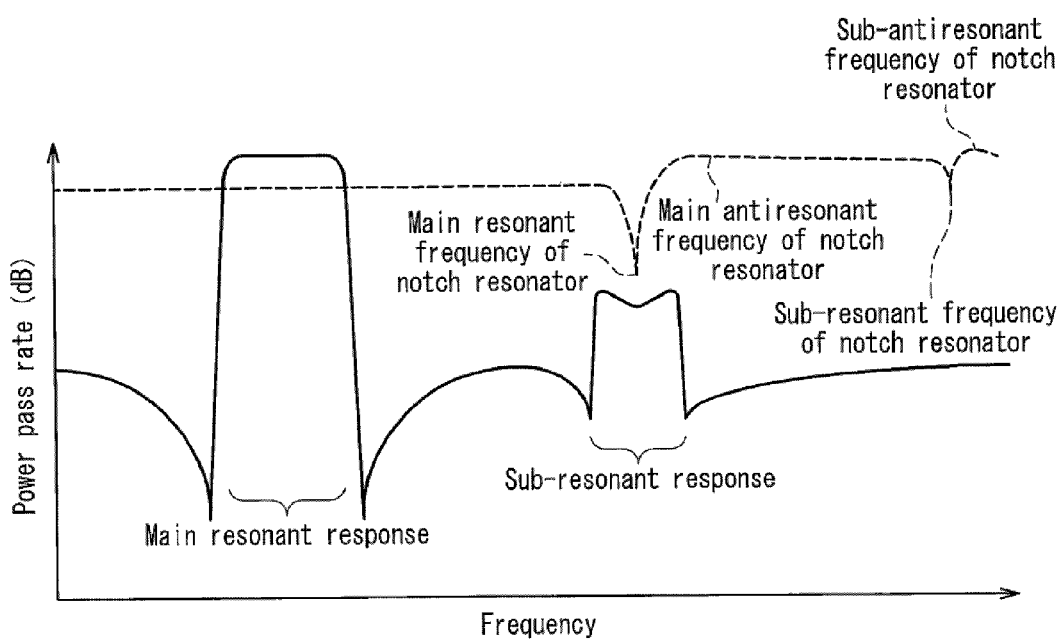
FIG. 12C is a characteristics diagram illustrating exemplary bandpass characteristics of the ladder-type filter and the parallel notch resonator in a wide frequency band.
Figure 13A:
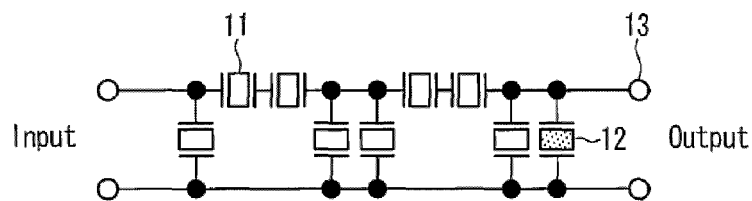
FIG. 13A is a circuit diagram of a ladder-type filter in which the parallel notch resonator is connected.
Figure 13B:
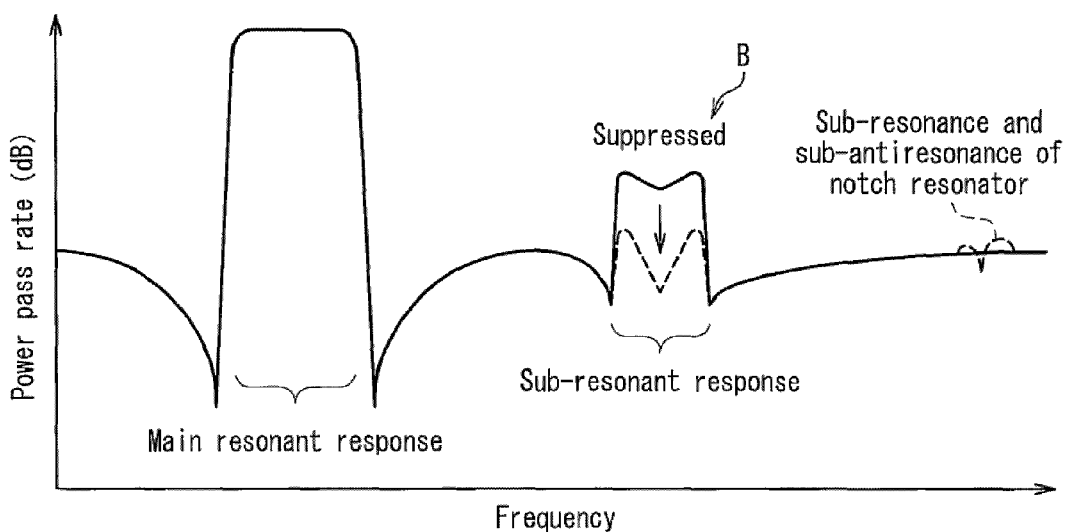
FIG. 13B is a characteristics diagram illustrating exemplary bandpass characteristics of the ladder-type filter in which the parallel notch resonator is connected, in a wide frequency band.

FIG. 12A is a circuit diagram of a ladder-type filter in which the plurality of acoustic wave resonators 1 are connected in a ladder shape. FIG. 12B is a circuit diagram of a parallel notch resonator 12. FIG. 12C illustrates exemplary bandpass characteristics of the ladder-type filter and the parallel notch resonator in a wide frequency band. In FIG. 12C, a solid line indicates the bandpass characteristics of the ladder-type filter, and a dashed line indicates the bandpass characteristics of the parallel notch resonator. FIG. 13A is a circuit diagram of a ladder-type filter obtained by connecting the parallel notch resonator 12 illustrated in FIG. 12B to the ladder-type filter illustrated in FIG. 12A. FIG. 13B illustrates bandpass characteristics of a conventional ladder-type filter and the ladder-type filter illustrated in FIG. 13A. In FIG. 13B, a solid line indicates the bandpass characteristics of the conventional ladder-type filter, and a dashed line indicates the bandpass characteristics of the ladder-type filter illustrated in FIG. 13A.

As illustrated in FIG. 12C, the parallel notch resonator 12 illustrated in FIG. 12B has a main resonant frequency that is set close to a sub-resonant response frequency of the ladder-type filter illustrated in FIG. 12A. A surface acoustic wave resonator, a love wave resonator, or a boundary acoustic wave resonator used as the parallel notch resonator 12 has a main resonant frequency and a main antiresonant frequency that can be adjusted according to the film thickness, width, period, and the like of a comb-shaped electrode. Further, a film bulk acoustic resonator has a main resonant frequency and a main antiresonant frequency that can be adjusted according to the film thickness and the like of an upper electrode, a lower electrode, and a piezoelectric film.

For example, FIG. 13A illustrates a ladder-type filter obtained by connecting the parallel notch resonator 12 illustrated in FIG. 12B to an output terminal 3 of the ladder-type filter illustrated in FIG. 12A. The ladder-type filter illustrated in FIG. 13A has its sub-resonant response suppressed as shown in the bandpass characteristics indicated by the dashed line in FIG. 13B. As indicated by B in FIG. 13B, the suppression characteristics of the parallel notch resonator 12 vary slightly in the vicinity of a sub-resonant frequency and a sub-antiresonant frequency as compared with the bandpass characteristics of the ladder-type filter in which the parallel notch resonator 12 is not connected. However, the variation in the suppression characteristics is so small that it has no adverse effect on the performance of the filter. Note here that an input/output impedance of the filter may be shifted by connecting the parallel notch resonator 12. Thus, in order to allow the filter to have an input/output impedance of a desired value, it is preferable to adjust a capacitance or the like of acoustic wave resonators 11 included in the filter.

In each of the above-described ladder-type filters, although the notch resonator is connected to the output terminal of the filter, the notch resonator may be connected to an input terminal of the filter, which results in the same effect. Further, the notch resonator may be connected not only to the input terminal but also to various portions of the filter, which results in the same effect. In each of the above-described ladder-type filters, although one notch resonator is connected, two or more notch resonators may be connected, which results in the same effect.

Figure 14A:
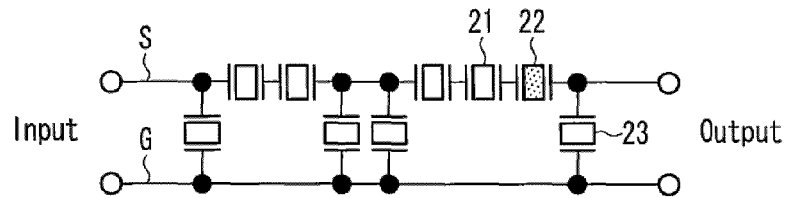
FIGS. 14A to 14E are circuit diagrams illustrating variations of the ladder-type filter in which the series notch resonator is connected.
Figure 14B:
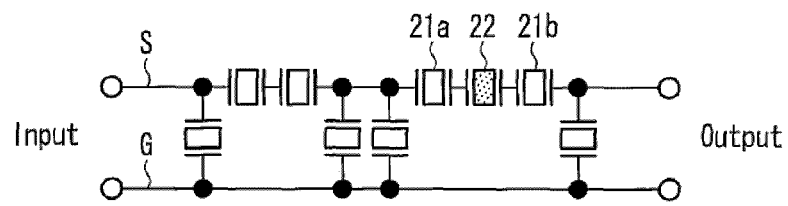
Figure 14C:
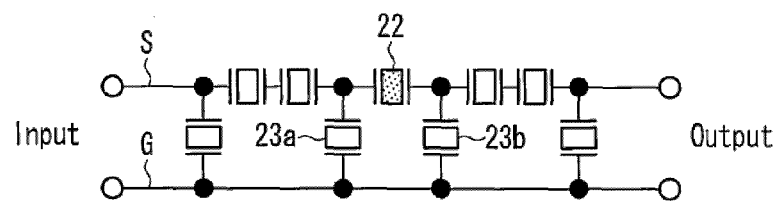
Figure 14D:
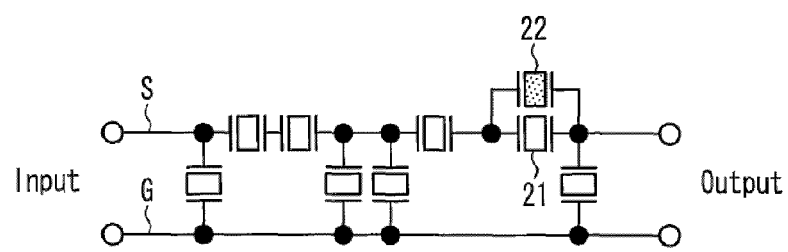
Figure 14E:
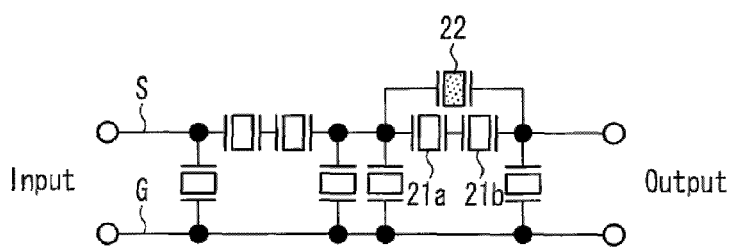

FIG. 14A is a circuit diagram of a ladder-type filter in which a series notch resonator 22 is connected between a series resonator 21 and a parallel resonator 23. FIG. 14B is a circuit diagram of a ladder-type filter in which the series notch resonator 22 is connected between series resonators 21a and 21b. FIG. 14C is a circuit diagram of a ladder-type filter in which the series notch resonator 22 is connected between parallel resonators 23a and 23b. FIG. 14D is a circuit diagram of a ladder-type filter in which the series notch resonator 22 is connected in parallel with the series resonator 21. FIG. 14E is a circuit diagram of a ladder-type filter in which the series notch resonator 22 is connected in parallel with the plurality of series resonators 21a and 21b. As illustrated in FIGS. 14A to 14E, the series notch resonator 22 may be connected to any portion of the ladder-type filter, thereby suppressing sub-resonant responses. In the circuit of the ladder-type filter of the present embodiment, a resonator whose both ends are connected to a signal line S (see FIG. 14A, for example) is defined as a "series resonator", and a resonator whose both ends are connected between the signal line S and a ground line G is defined as a "parallel resonator".

Figure 15A:
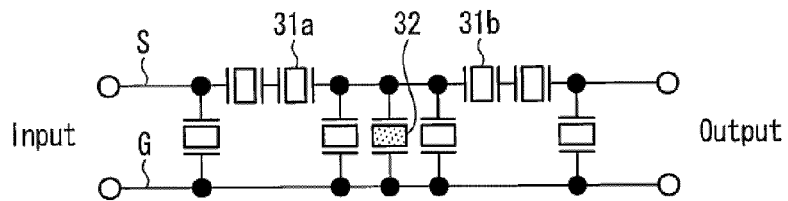
FIGS. 15A to 15E are circuit diagrams illustrating variations of the ladder-type filter in which the parallel notch resonator is connected.
Figure 15B:
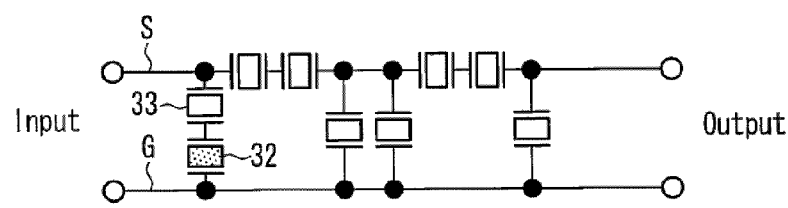
Figure 15C:
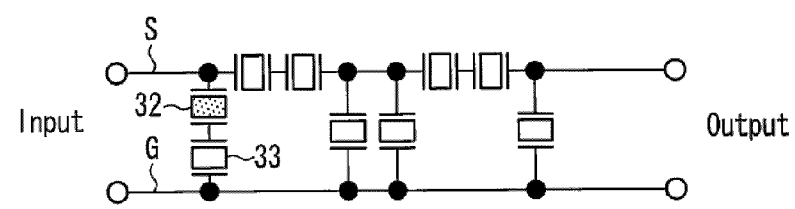
Figure 15D:
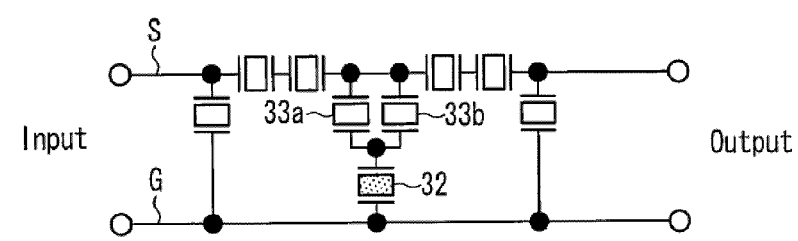
Figure 15E:
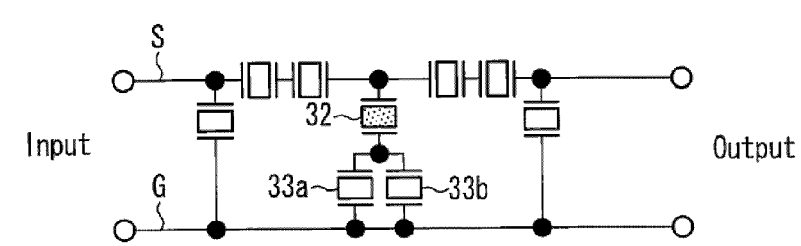

FIG. 15A is a circuit diagram of a ladder-type filter in which a parallel notch resonator 32 is connected between series resonators 31a and 31b. FIG. 15B is a circuit diagram of a ladder-type filter in which the parallel notch resonator 32 is connected between a parallel resonator 33 and a ground line G. FIG. 15C is a circuit diagram of a ladder-type filter in which the parallel notch resonator 32 is connected between the parallel resonator 33 and a signal line S. FIG. 15D is a circuit diagram of a ladder-type filter in which the parallel notch resonator 32 is connected between a node between a plurality of parallel notch resonators 33a and 33b on a ground line G side and the ground line G. FIG. 15E is a circuit diagram of a ladder-type filter in which the parallel notch resonator 32 is connected between a node between the plurality of parallel notch resonators 33a and 33b on a signal line S side and the signal line S. As illustrated in FIGS. 15A to 15E, the parallel notch resonator 32 may be connected to any portion of the ladder-type filter, thereby suppressing sub-resonant responses.

Figure 16A:
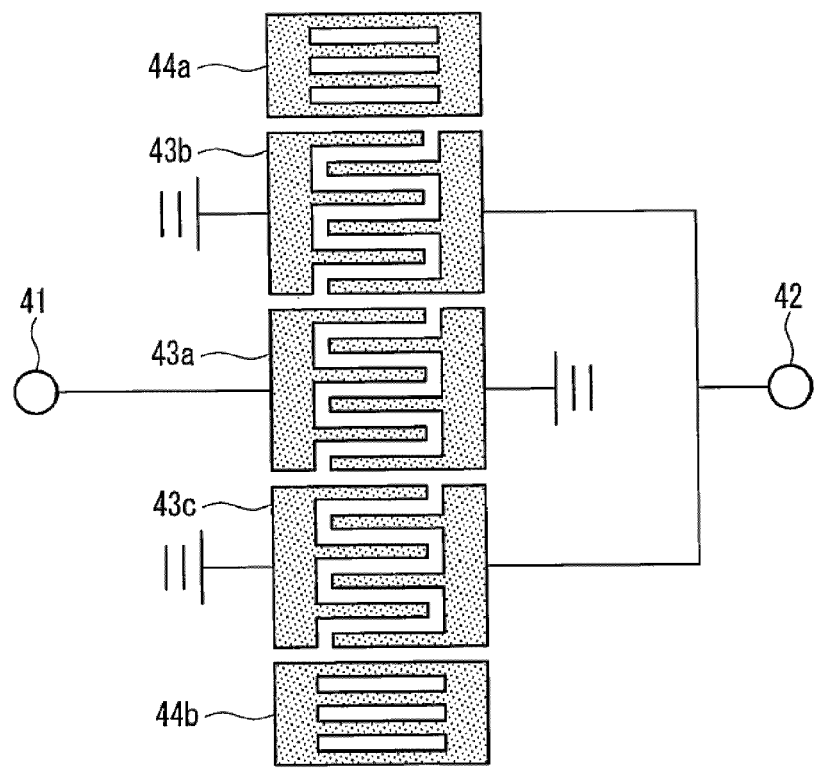
FIG. 16A is a schematic diagram of a double-mode filter (unbalanced output filter).

The method for suppressing sub-resonant responses of the present invention is not limited to use in the above-described ladder-type filters, but is applicable to any types of acoustic wave filters. For example, the method also is applicable to a double-mode filter (unbalanced output filter) using surface acoustic waves, love waves or boundary acoustic waves as illustrated in FIG. 16A. In the double-mode filter illustrated in FIG. 16A, an input comb-shaped electrode 43a is connected to an input terminal 41, and output comb-shaped electrodes 43b and 43c are connected to an output terminal 42. The input comb-shaped electrode 43a and the output comb-shaped electrodes 43b and 43c are arranged in parallel, and reflectors 44a and 44b are arranged in parallel with the output comb-shaped electrodes 43b and 43c.

Figure 16B:
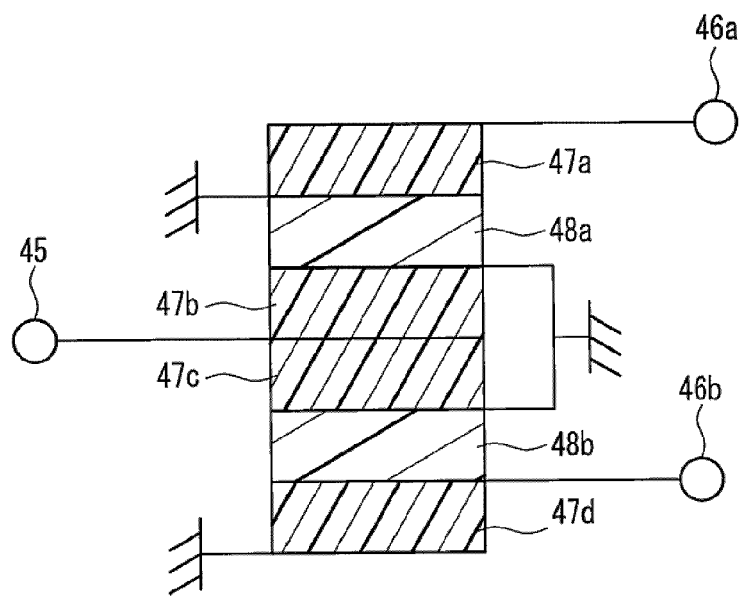
FIG. 16B is a schematic diagram of a double-mode filter (balanced output filter).

The method for suppressing sub-resonant responses of the present invention is also applicable to a piezoelectric thin film double-mode filter (balanced output filter) as illustrated in FIG. 16B. FIG. 16B is a cross-sectional view of the piezoelectric thin film double-mode filter. In the double-mode filter illustrated in FIG. 16B, a first resonance portion and a second resonance portion are laminated. In the first resonance portion, a dielectric film 48a is sandwiched between a pair of piezoelectric films 47a and 47b. In the second resonance portion, a dielectric film 48b is sandwiched between a pair of piezoelectric films 47c and 47d. An input terminal 45 is connected to a junction between the first resonance portion and the second resonance portion. An output terminal 46a is connected to the piezoelectric film 47a on the first resonance portion side. An output terminal 46b is connected to the piezoelectric film 47d on the second resonance portion side.

In both the balanced output double-mode filter and the unbalanced output double-mode filter illustrated in FIGS. 16A and 16B, the series notch resonator (see FIG. 10B, for example) or the parallel notch resonator (see FIG. 12, for example) may be connected to the input terminal or the output terminal, thereby suppressing sub-resonant responses.

Configuration of a duplexer

Figure 17A:
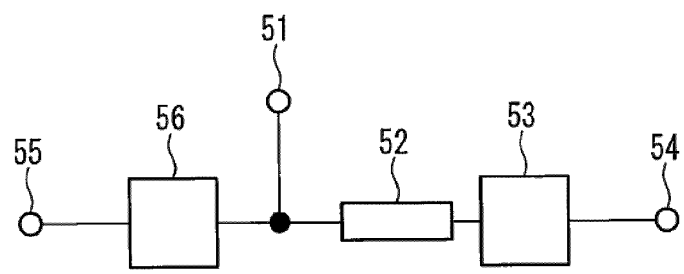
FIG. 17A is a circuit diagram of a conventional duplexer.
Figure 17B:
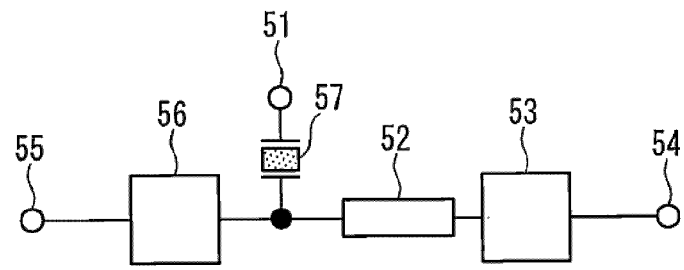
FIG. 17B is a circuit diagram of a duplexer in which a series notch resonator is connected to an antenna terminal.
Figure 17C:
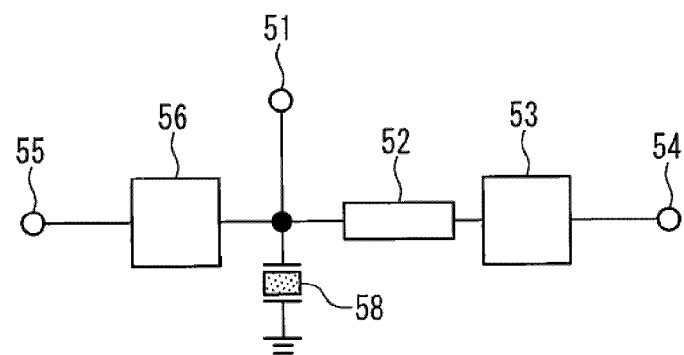
FIG. 17C is a circuit diagram of a duplexer in which a parallel notch resonator is connected to an antenna terminal.

FIG. 17A is a circuit diagram of a duplexer. The duplexer includes a transmission filter 56, a reception filter 53, and a matching circuit 52. When a notch resonator is connected to the transmission filter 56 or the reception filter 53, the duplexer has its sub-resonant responses suppressed. As illustrated in FIG. 17B, when a series notch resonator 57 is connected to an antenna terminal 51, the duplexer has its sub-resonant responses suppressed. As illustrated in FIG. 17C, when a parallel notch resonator 58 is connected to the antenna terminal 51, the duplexer has its sub-resonant responses suppressed. Each of the notch resonators 57 and 58 has a main resonant frequency that can be made substantially equal to a sub-resonant frequency of the transmission filter 56 or a sub-resonant frequency of the reception filter 53.

Figure 18A:
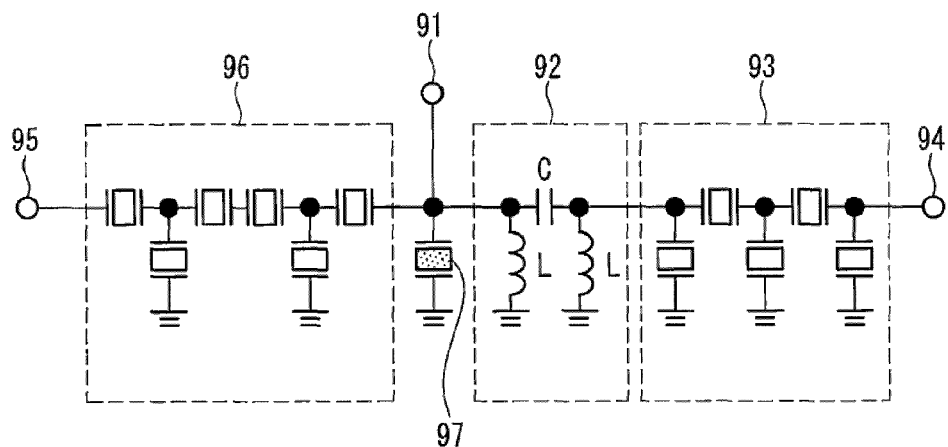
FIG. 18A is a circuit diagram of the duplexer in which the parallel notch resonator is connected to the antenna terminal.

FIG. 18A is a circuit diagram illustrating an example of the duplexer illustrated in FIG. 17C. A transmission filter 96 and a reception filter 93 in FIG. 18A are 4-pole ladder-type filters using love wave resonators. A matching circuit 92 is a circuit in which inductors L and a capacitor C are connected in a π-shape. A parallel notch resonator 97 is connected to an antenna terminal 91. The parallel notch resonator 97 is a love wave resonator. The period of a comb-shaped electrode of the parallel notch resonator 97 is adjusted so that the parallel notch resonator 97 has a main resonant frequency that is substantially equal to a sub-resonant frequency of the reception filter 93.

Figure 18B:
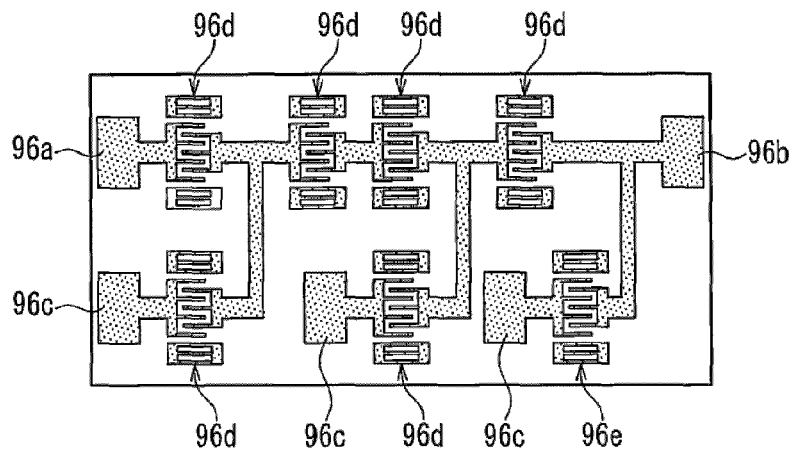
FIG. 18B is a schematic diagram of a transmission filter chip.

FIG. 18B illustrates a chip structure of the transmission filter 96. In the transmission filter chip illustrated in FIG. 18B, a plurality of acoustic wave filters 96d are connected to each other in series or parallel. At both ends of a signal line S, an input terminal 96a connected to a transmission terminal 95, and an output terminal 96b connected to the antenna terminal 91 are provided. A notch resonator 96e is connected between the signal line S and a ground terminal 96c. With this configuration, the transmission filter 96 has its sub-resonant responses suppressed.

Figure 18C:
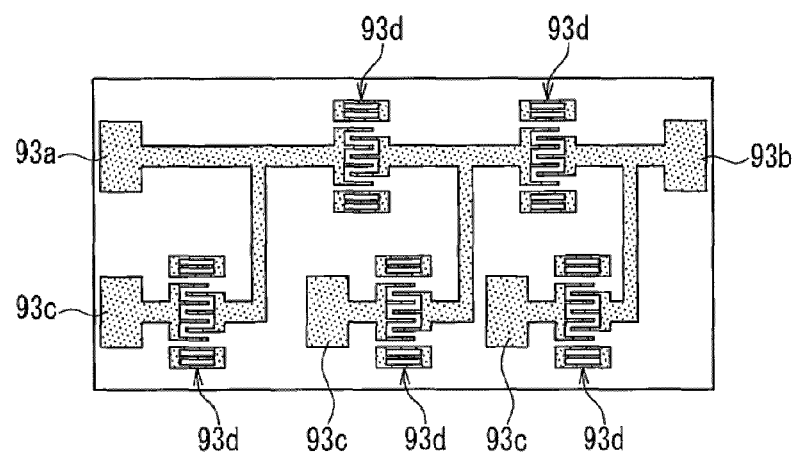
FIG. 18C is a schematic diagram of a reception filter chip.

FIG. 18C illustrates a chip structure of the reception filter 93. In the reception filter chip illustrated in FIG. 18C, a plurality of acoustic wave filters 93d are connected to each other in series or parallel. At both ends of a signal line S, an input terminal 93a connected to the matching circuit 92, and an output terminal 93h connected to a reception terminal 94 are provided. The reception filter chip illustrated in FIG. 18C includes no notch resonator. In other words, a series notch resonator or a parallel notch resonator may be provided on either an input side (e.g., the reception filter 93) or an output side (e.g., the transmission filter 96) of the duplexer. For comparison, a conventional duplexer in which no parallel notch resonator is connected to an antenna terminal (no notch resonator is provided on a transmission chip) also is manufactured.

Figure 19A:
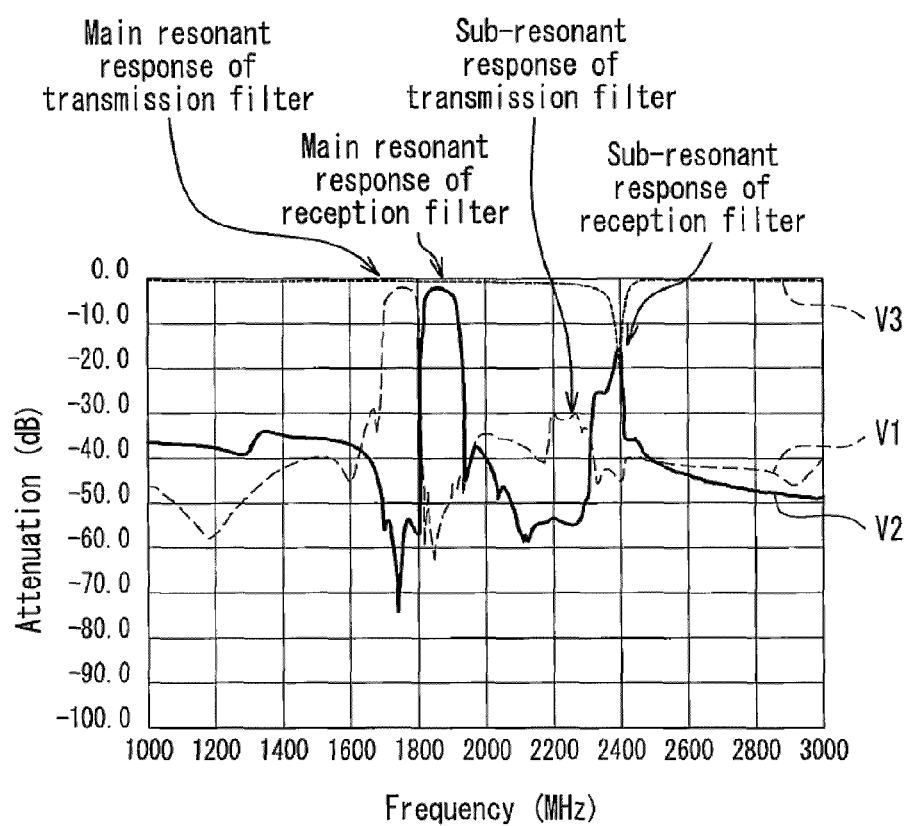
FIG. 19A is a characteristics diagram illustrating filter characteristics of the conventional duplexer and frequency characteristics of the notch resonator alone.

FIG. 19A illustrates filter characteristics of the conventional duplexer in which no notch resonator is connected and frequency characteristics of the notch resonator alone. V1 indicates frequency characteristics of the transmission filter, and V2 indicates frequency characteristics of the reception filter. As indicated by V1 and V2, the transmission filter and the reception filter have their sub-resonant responses in the vicinity of 2200 to 2400 MHz. V3 indicates bandpass characteristics of the parallel notch resonator alone. As indicated by V3, the parallel notch resonator has a main resonant frequency that is substantially equal to the sub-resonant response frequency of the reception filter.

Figure 19B:
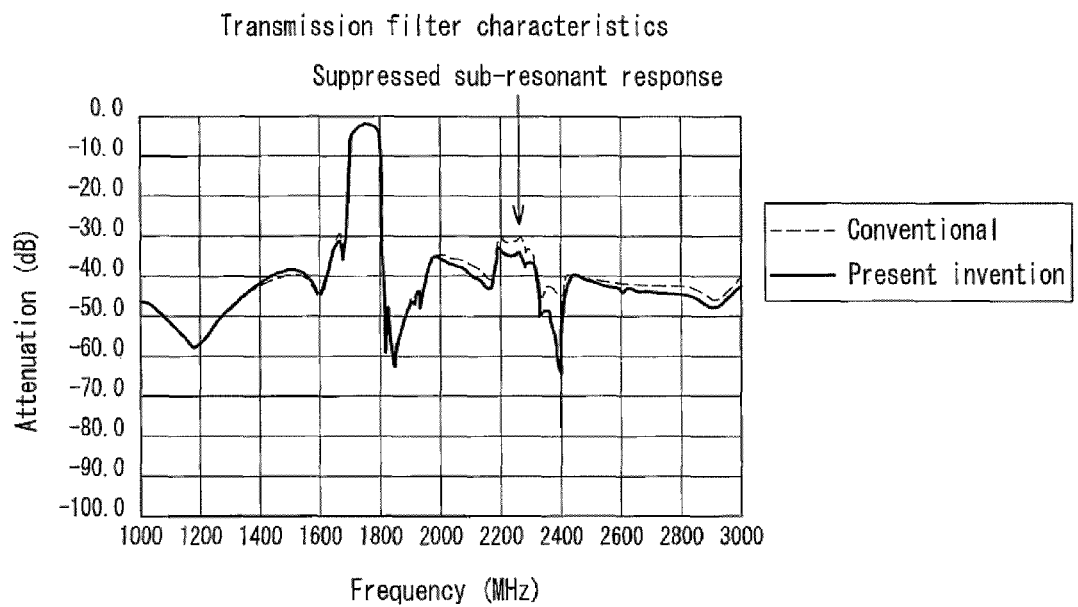
FIG. 19B is a characteristics diagram illustrating frequency characteristics of a transmission filter.
Figure 19C:
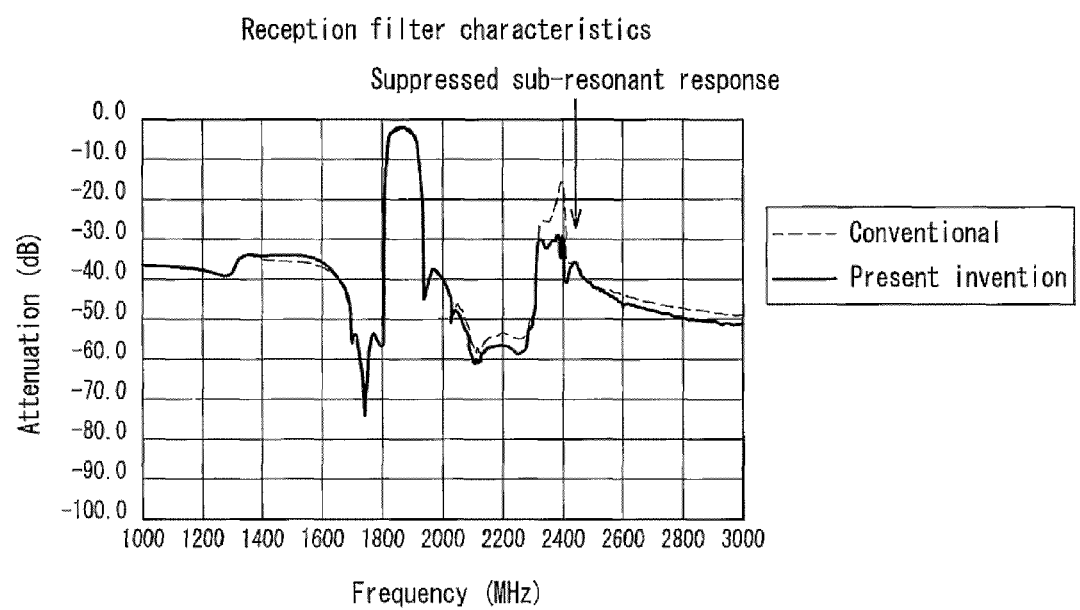
FIG. 19C is a characteristics diagram illustrating frequency characteristics of a reception filter.

FIG. 19B illustrates the frequency characteristics of the transmission filter in the case where the parallel notch resonator is not connected to the antenna terminal (i.e., the conventional filter), and in the case where the parallel notch resonator is connected to the antenna terminal (e.g., the filter illustrated in FIG. 18A). FIG. 19C illustrates the frequency characteristics of the reception filter in the case where the parallel notch resonator is not connected to the antenna terminal (i.e., the conventional filter), and in the case where the parallel notch resonator is connected to the antenna terminal (e.g., the filter illustrated in FIG. 18A). When the parallel notch resonator is connected to the antenna terminal, the reception filter has its sub-resonant response suppressed significantly as illustrated in FIG. 19C, and the transmission filter also has its sub-resonant response suppressed slightly as illustrated in FIG. 19B. This is because the notch resonator connected to the antenna terminal of the duplexer can affect not only the reception filter characteristics but also the transmission filter characteristics. Also, it can be seen that connecting the parallel notch resonator has a small influence on a main resonant response of the duplexer.

Configuration of a communication module

Figure 20:
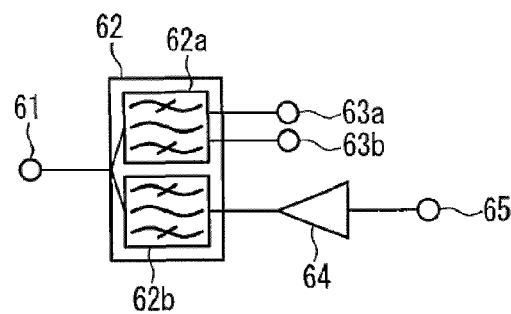
FIG. 20 is a block diagram of a communication module.

FIG. 20 illustrates an exemplary communication module including the acoustic wave filter or the duplexer of the present embodiment. As illustrated in FIG. 20, a duplexer 62 includes a reception filter 62a and a transmission filter 62b. The reception filter 62a is connected with reception terminals 63a and 63b that are compatible with balanced output, for example. Further, the transmission filter 62b is connected to a transmission terminal 65 via a power amplifier 64. The reception filter 62a and the transmission filter 62b include the acoustic wave filter of the present embodiment.

In a receiving operation, the reception filter 62a receives reception signals via an antenna terminal 61, allows only signals in a predetermined frequency band to pass, and outputs the resultant signals to the outside from the reception terminals 63a and 63b. In a transmitting operation, the transmission filter 62b receives transmission signals that have been input from the transmission terminal 65 and amplified by the power amplifier 64, allows only signals in a predetermined frequency band to pass, and outputs the resultant signals to the outside from the antenna terminal 61.

When the acoustic wave filter or the duplexer of the present embodiment is included in the reception filter 62a and the transmission filter 62b of the communication module, the communication module has its sub-resonant responses suppressed, resulting in an improvement in communication characteristics.

The configuration of the communication module illustrated in FIG. 20 is an example. The filter of the present invention may be mounted on a communication module in another form, which results in the same effect.

Configuration of a communication apparatus

Figure 21:
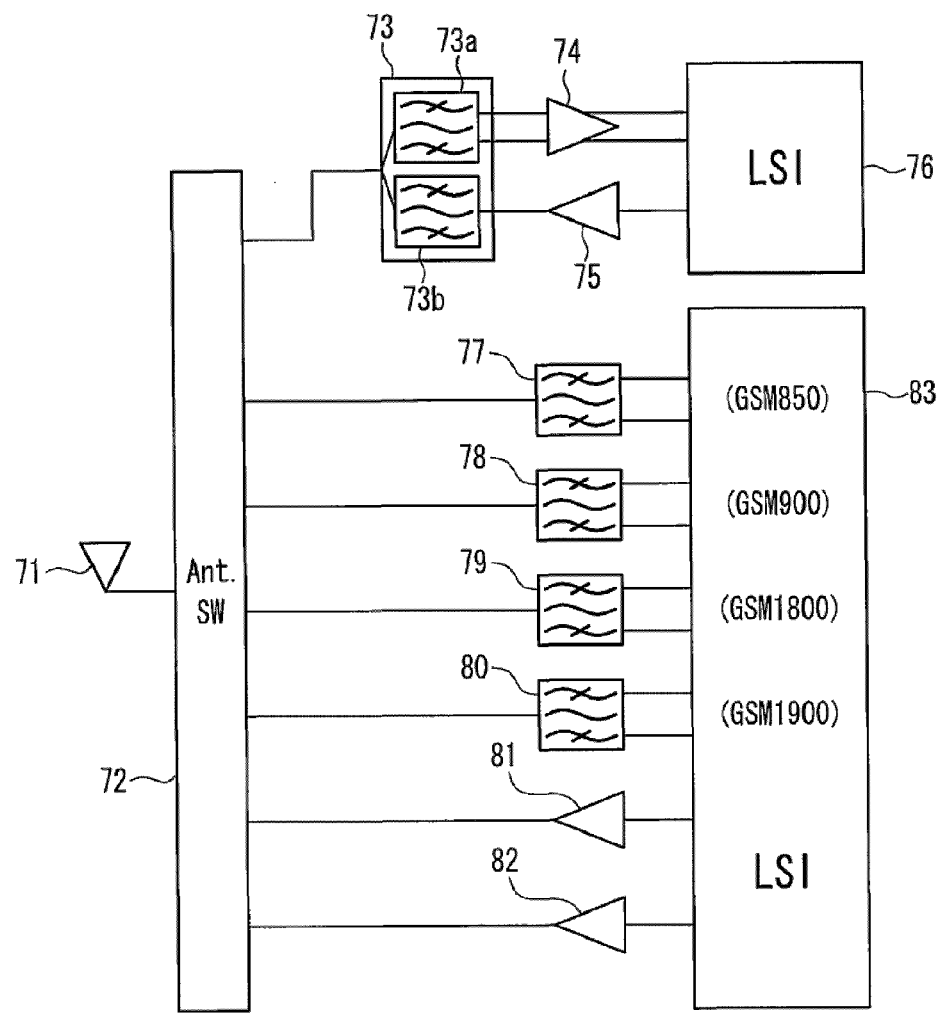
FIG. 21 is a block diagram of a communication apparatus.

FIG. 21 illustrates an RF block of a mobile phone terminal as an example of a communication apparatus including the acoustic wave filter or the communication module of the present embodiment. The communication apparatus illustrated in FIG. 21 is a mobile phone terminal that is compatible with a GSM (Global System for Mobile Communications) communication system and a W-CDMA (Wideband Code Division Multiple Access) communication system. The GSM communication system in the present embodiment is compatible with a 850 MHz band, a 950 MHz band, a 1.8 GHz band, and a 1.9 GHz band. Although the mobile phone terminal includes a microphone, a speaker, a liquid crystal display, and the like in addition to the components illustrated in FIG. 21, they are not illustrated in the figure because they are not necessary for describing the present embodiment. Here, reception filters 73a, 77, 78, 79, and 80 and a transmission filter 73b include the acoustic wave filter of the present embodiment.

First, an antenna switch circuit 72 selects an LSI to be operated, based on whether the communication system of a reception signal input via an antenna 71 is W-CDMA or GSM. If the input reception signal conforms to the W-CDMA communication system, the antenna switch circuit 72 performs switching so that the reception signal is output to a duplexer 73. The reception signal input to the duplexer 73 is limited to a predetermined frequency band by the reception filter 73a, and the resultant balanced reception signal is output to an LNA 74. The LNA 74 amplifies the input reception signal, and outputs the amplified reception signal to an LSI 76. The LSI 76 performs demodulation processing for obtaining an audio signal based on the input reception signal, and controls operations of respective units in the mobile phone terminal.

On the other hand, in the case of transmitting a signal, the LSI 76 generates a transmission signal. A power amplifier 75 amplifies the generated transmission signal, and outputs the amplified transmission signal to the transmission filter 73b. The transmission filter 73b receives the transmission signals, and allows only signals in a predetermined frequency band to pass. The transmission filter 73b outputs the resultant transmission signals to the outside from the antenna 71 via the antenna switch circuit 72.

If the input reception signal conforms to the GSM communication system, the antenna switch circuit 72 selects one of the reception filters 77 to 80 in accordance with the frequency band of the reception signal, and outputs the reception signal to the selected reception filter. The reception signal is band-limited by the selected one of the reception filters 77 to 80, and the band-limited reception signal is input to an LSI 83. The LSI 83 performs demodulation processing for obtaining an audio signal based on the input reception signal, and controls operations of the respective units in the mobile phone terminal. On the other hand, in the case of transmitting a signal, the LSI 83 generates a transmission signal. A power amplifier 81 or 82 amplifies the generated transmission signal, and outputs the amplified signal to the outside from the antenna 71 via the antenna switch circuit 72.

When the acoustic wave filter or the communication module including the acoustic wave filter of the present embodiment is included in the communication apparatus, the communication apparatus has its sub-resonant responses suppressed, resulting in an improvement in communication characteristics.

Effect etc. of the embodiment

According to the present embodiment, the notch resonator is connected in series or parallel in the acoustic wave filter, so that the occurrence of sub-resonant responses in the filter characteristics can be suppressed, resulting in an improvement in communication characteristics.

According to the present embodiment, it is possible to suppress sub-resonant responses without deteriorating a main resonant response.

The acoustic wave resonators 1, 93d, and 96d, the series resonators 21, 21a, 21b, 31a, and 31b, and the parallel resonators 23, 23a, 23b, 33, 33a, and 33b in the present embodiment are examples of the acoustic wave resonator of the present invention. The series notch resonators 2, 22, and 57, and the parallel notch resonators 12, 32, 58, 96e, and 97 in the present embodiment are examples of the notch resonator of the present invention. The antenna terminals 51, 61, 71, and 91 in the present embodiment are examples of the antenna terminal of the present invention. The reception filters 53, 62*a*, and 93 in the present embodiment are examples of the reception circuit of the present invention. The transmission filters 56, 62*b*, and 96 in the present embodiment are examples of the transmission circuit of the present invention.

The invention claimed is:

1. An acoustic wave filter comprising a set of acoustic wave resonators, and a notch resonator connected in series or parallel with the acoustic wave resonators,
    wherein the notch resonator has a main frequency at which a main notch is located in its frequency-power pass characteristics that is substantially equal to a sub-resonant frequency of said set of the acoustic wave resonators, the set of the acoustic wave resonators without the notch resonator exhibiting a sub-passband at the sub-resonant frequency.

2. The acoustic wave filter according to claim 1, wherein the acoustic wave resonators are connected in a ladder shape.

3. The acoustic wave filter according to claim 1, wherein the notch resonator is connected in series to an input terminal or an output terminal.

4. The acoustic wave filter according to claim 1, wherein the notch resonator is connected in parallel to an input terminal or an output terminal.

5. The acoustic wave filter according to claim 1, wherein the acoustic wave resonators are double-mode resonators.

6. The acoustic wave filter according to claim 2, wherein the notch resonator is connected in series between a series resonator connected in series with a signal line and a parallel resonator connected in parallel with the signal line and a ground line.

7. The acoustic wave filter according to claim 2, wherein the notch resonator is connected in series between a plurality of series resonators connected in series with a signal line.

8. The acoustic wave filter according to claim 2, wherein the notch resonator is connected in series between parallel resonators connected in parallel with a signal line and a ground line.

9. The acoustic wave filter according to claim 2, wherein the notch resonator is connected in parallel with a series resonator connected in series with a signal line.

10. The acoustic wave filter according to claim 2, wherein the notch resonator is connected in parallel with a plurality of series resonators connected in series with a signal line.

11. The acoustic wave filter according to claim 2, wherein the notch resonator is connected in parallel between a plurality of series resonators connected in series with a signal line.

12. The acoustic wave filter according to claim 2, wherein the notch resonator is connected in series between a parallel resonator connected in parallel with a signal line and a ground line and the ground line.

13. The acoustic wave filter according to claim 2, wherein the notch resonator is connected in series between a parallel resonator connected in parallel with a signal line and a ground line and the signal line.

14. The acoustic wave filter according to claim 2, wherein the notch resonator is connected in series between a node on a ground line side between a plurality of parallel resonators connected in parallel with a signal line and a ground line and the ground line.

15. The acoustic wave filter according to claim 2, wherein the notch resonator is connected in series between a node on a signal line side between a plurality of parallel resonators connected in parallel with a signal line and a ground line and the signal line.

16. A communication module comprising the acoustic wave filter according to claim 1.

17. A communication apparatus comprising the communication module according to claim 16.

18. A duplexer comprising:
    an antenna terminal connected to an antenna;
    a reception circuit that is connected to the antenna terminal and receives a reception signal from the antenna via the antenna terminal;
    a transmission circuit that is connected to the antenna terminal and transmits a transmission signal to the antenna via the antenna terminal; and
    a notch resonator connected to the antenna terminal,
    wherein the reception circuit and the transmission circuit have acoustic wave resonators,
    the notch resonator has a main resonant frequency that is substantially equal to a sub-resonant frequency of the acoustic wave resonators, and
    wherein the notch resonator is connected in parallel to the antenna terminal.

19. An acoustic wave filter, comprising:
    a ladder filter comprising a plurality of acoustic wave resonators; and
    a notch resonator connected to the ladder filter,
    wherein bandpass characteristics of the ladder filter without said notch resonator have a main passband due to main resonance and a sub-passband located at a frequency outside of the main passband, and
    wherein the notch resonator has a main notch in its frequency-power pass characteristics at a frequency that is substantially equal to said frequency of said sub-passband of said ladder filter without said notch resonator so as to suppress said sub-passband.

20. The acoustic wave filter according to claim 19, wherein the notch resonator comprises an acoustic wave resonator having a main resonant frequency and a main anti-resonant frequency.

21. The acoustic wave filter according to claim 20, wherein the notch resonator is connected to a series leg of the ladder filter, and the main anti-resonant frequency of the notch resonator is substantially equal to said sub-resonant frequency of said ladder filter.

22. The acoustic wave filter according to claim 20, wherein the notch resonator is connected to a parallel leg of the ladder filter, and the main resonant frequency of the notch resonator is substantially equal to said sub-resonant frequency of said ladder filter.

* * * * *